(12) United States Patent
Sheng et al.

(10) Patent No.: US 10,783,969 B2
(45) Date of Patent: Sep. 22, 2020

(54) SENSE AMPLIFIER

(71) Applicant: Wuhan Xinxin Semiconductor Manufacturing Co., Ltd., Wuhan, Hubei (CN)

(72) Inventors: Bin Sheng, Hubei (CN); Zhifeng Mao, Hubei (CN); Shengbo Zhang, Hubei (CN)

(73) Assignee: Wuhan Xinxin Semiconductor Manufacturing Co., Ltd., Wuhan, Hubei (CN)

( * ) Notice: Subject to any disclaimer, the term of this patent is extended or adjusted under 35 U.S.C. 154(b) by 0 days.

(21) Appl. No.: 16/200,064

(22) Filed: Nov. 26, 2018

(65) Prior Publication Data

US 2019/0279717 A1 Sep. 12, 2019

(30) Foreign Application Priority Data

Mar. 12, 2018 (CN) .......................... 2018 1 0202084

(51) Int. Cl.
| | |
|---|---|
| *G11C 11/34* | (2006.01) |
| *G11C 16/12* | (2006.01) |
| *G11C 7/06* | (2006.01) |
| *G11C 16/28* | (2006.01) |
| *G11C 7/12* | (2006.01) |
| *G11C 7/08* | (2006.01) |

(52) U.S. Cl.
CPC ................ *G11C 16/12* (2013.01); *G11C 7/06* (2013.01); *G11C 7/067* (2013.01); *G11C 7/12* (2013.01); *G11C 16/28* (2013.01); *G11C 7/062* (2013.01); *G11C 7/08* (2013.01)

(58) Field of Classification Search
CPC ........... G11C 16/12; G11C 7/06; G11C 7/067; G11C 7/12; G11C 16/28; G11C 7/062; G11C 7/08
USPC .......................... 365/203, 185.21, 205, 185.2
See application file for complete search history.

(56) References Cited

U.S. PATENT DOCUMENTS

| | | | | |
|---|---|---|---|---|
| 5,818,268 | A * | 10/1998 | Kim ....................... | G11C 29/50 |
| | | | | 327/77 |
| 9,267,980 | B2 * | 2/2016 | Guo ....................... | G11C 29/02 |
| 9,378,834 | B2 * | 6/2016 | Qian ....................... | G11C 16/28 |
| 9,620,235 | B2 * | 4/2017 | Zhou ....................... | G11C 8/18 |
| 10,056,152 | B2 * | 8/2018 | Hahn ....................... | G11C 16/10 |
| 10,181,354 | B2 * | 1/2019 | Sheng ..................... | G11C 16/28 |

(Continued)

*Primary Examiner* — Viet Q Nguyen

(74) *Attorney, Agent, or Firm* — Muncy, Geissler, Olds & Lowe, P.C.

(57) ABSTRACT

A sense amplifier for a flash memory is disclosed which includes a pre-charging circuit, a first capacitor, a first inverter, and a first transmission gate connected in parallel with the first inverter, the pre-charging circuit is connectable to a reference voltage node, and is able to pre-charge a word line, of the flash memory, via the reference voltage node, a potential of the reference voltage node remains unchanged after the pre-charging is completed; a potential of the reference voltage node is adjustable according to a state of the flash memory until an output voltage of the first inverter changes; the first capacitor has a first end connected to the reference voltage node, a second end connected to an input of the first inverter and a first end of the first transmission gate; an output of the first inverter is connected to a second end of the first transmission gate.

9 Claims, 3 Drawing Sheets

(56) References Cited

U.S. PATENT DOCUMENTS

| | | | |
|---|---|---|---|
| 10,193,563 B2* | 1/2019 | Shionoiri | H03M 1/002 |
| 2015/0194193 A1* | 7/2015 | Zhang | G11C 16/08 |
| | | | 365/189.07 |
| 2016/0019972 A1* | 1/2016 | Zhou | G11C 8/18 |
| | | | 365/185.21 |

* cited by examiner

SENSE AMPLIFIER

CROSS-REFERENCE TO RELATED APPLICATION

This application claims the priority of Chinese patent application number 201810202084.5, filed on Mar. 12, 2018, the entire contents of which are incorporated herein by reference.

TECHNICAL FIELD

The present invention relates to the technical field of semiconductors, and in particular, to a sensor amplifier.

BACKGROUND

Storage technologies are widely applied in modern communication products. A sensor amplifier (i.e., a read amplifier) is a key component of a storage circuit. In a conventional single-ended sense amplifier (as shown in FIG. 1, including a storage unit 100, a column decoder 200 and a current mirroring circuit 300) of a flash memory, as shown in FIG. 2, a reference voltage node A' of a second-stage sense amplifier 400 is pre-charged to a power supply voltage VDD during a time period T1. After that, when performing an operation of reading "1" during a time period T2, the reference voltage node A' cannot reach an invert enabling voltage of the second-stage sense amplifier 400 until being discharged by several hundred millivolts, resulting in the need for relatively long data read time (the entire time period T2). This is particularly noticeable when a non-volatile flash memory unit, such as a NOR flash, is in a weak erase state and the read current is relatively small. In addition, for the second-stage sense amplifier 400, a mismatch between the performance indexes of transistors M100 and M200 therein will also cause changes in the invert enabling voltage of the sense amplifier.

SUMMARY OF THE INVENTION

The objective of the present invention is to provide a sense amplifier, in order to solve the problem in the existing flash memory of long data read time of the sense amplifier.

To solve the above technical problem, the present invention provides a sense amplifier for a flash memory, including a pre-charging circuit, a first capacitor, a first inverter, and a first transmission gate connected in parallel with the first inverter, wherein:

the pre-charging circuit is connectable to a reference voltage node of the flash memory and is able to pre-charge a word line of the flash memory via the reference voltage node, wherein a potential of the reference voltage node remains unchanged after the pre-charging is completed;

a potential of the reference voltage node is adjustable according to a state of the flash memory until an output voltage of the first inverter changes;

the first capacitor has a first end connectable to the reference voltage node, and a second end connected to an input of the first inverter and a first end of the first transmission gate;

an output of the first inverter is connected to a second end of the first transmission gate.

Optionally, in the sense amplifier, the sense amplifier further includes a second inverter and a third inverter, wherein an input of the second inverter is connected to the output of the first inverter, and an output of the second inverter is connected to an input of the third inverter.

Optionally, in the sense amplifier, the pre-charging circuit includes a first transistor and a second transmission gate, wherein:

the first transistor is a P-channel field effect transistor; a gate of the first transistor is connected to a drain of the first transistor, and a source of the first transistor is connected to a power supply voltage; a first end of the second transmission gate is connected to the drain of the first transistor, and a second end of the second transmission gate is connectable to the reference voltage node.

Optionally, in the sense amplifier, the first transmission gate is controlled by a first control signal; when a level of the first control signal is a ground level, the first and second ends of the first transmission gate have equal potentials; and when the level of the first control signal equals the power supply voltage, the first and second ends of the first transmission gate have different potentials.

Optionally, in the sense amplifier, the second transmission gate is also controlled by the first control signal; when the level of the first control signal is the ground level, the first and second ends of the second transmission gate have equal potentials; and when the level of the first control signal equals the power supply voltage, the first and second ends of the second transmission gate have different potentials.

Optionally, in the sense amplifier, the flash memory further includes a current mirroring circuit, a storage unit, and a column decoder, wherein the storage unit is connected to the column decoder, and the column decoder is connected to the current mirroring circuit.

Optionally, in the sense amplifier, the current mirroring circuit includes a second transistor, a third transistor, a fourth transistor, and a fifth transistor, wherein:

a source of the second transistor and a source of the third transistor are connected to the power supply voltage, a gate of the second transistor is connected to a gate of the third transistor, the gate of the second transistor is connected to a drain of the second transistor and a source of the fourth transistor, a drain of the third transistor is connected to a source of the fifth transistor and the reference voltage node, and a drain of the fourth transistor and a drain of the fifth transistor are connected to the column decoder.

Optionally, in the sense amplifier, the current mirroring circuit further includes a fourth inverter and a fifth inverter, where:

an input of the fourth inverter is connected to the drain of the fourth transistor, and an output of the fourth inverter is connected to a gate of the fourth transistor;

an input of the fifth inverter is connected to the drain of the fifth transistor, and an output of the fifth inverter is connected to a gate of the fifth transistor.

Optionally, in the sense amplifier, when the storage unit is in an erase state, the potential of the reference voltage node continuously decreases until the output voltage of the first inverter changes.

The present invention provides another sense amplifier for a flash memory, including a first capacitor, a first inverter, a first transmission gate, a first transistor and a second transmission gate, wherein: the first transmission gate is connected in parallel with the first inverter; the first capacitor has a first end connectable to a reference voltage node of the flash memory, and a second end connected to an input of the first inverter and a first end of the first transmission gate; an output of the first inverter is connected to a second end of the first transmission gate; a gate of the first transistor is connected to a drain of the first transistor, and a source of the first transistor is connected to a power supply voltage; a first end of the second transmission gate is connected to the drain of the first transistor, and a second end of the second transmission gate is connectable to the reference voltage node.

In the sense amplifier provided by the present invention, by connecting one end of the first capacitor with the reference voltage node and the other end with the input of the first inverter, and connecting the first inverter in parallel with the first transmission gate, the potential of the other end of the first capacitor will change correspondingly due to the coupling effect of the first capacitor; moreover, as the potential of the other end of the first capacitor is at an equilibrium level of the first inverter, the gain of the first inverter is maximum at this time. Therefore, a correct inversion at the output of the first inverter IN1 can be achieved after merely a few tens of millivolts of change of the voltage of node B, and hence the corresponding data reading can be completed, which greatly reduces data read time, and thus improving the read speed.

In addition, as the difference between the input voltage and the output voltage of the first inverter in the second-stage sense amplifier is limited to the equilibrium level of the first inverter when the pre-charging is finished, the first inverter always obtains a maximum gain. Even if a performance index mismatch exists in the field effect transistors of the sense amplifier, because the difference between the input voltage and the output voltage of the first inverter in the second-stage sense amplifier is limited to the equilibrium level of the first inverter, the influence of the mismatch on the sense amplifier is eliminated and high resolution is achieved.

the prior art: 100—storage unit; 200—column decoder; 300—current mirroring circuit; and 400—sense amplifier;

the present invention: 10—storage unit; 20—column decoder; 30—current mirroring circuit; and 40—sense amplifier.

DETAILED DESCRIPTION OF EXEMPLARY EMBODIMENTS

The sense amplifier proposed by present invention is further described in detail below in conjunction with the accompanying drawings and specific embodiments. The advantages and features of the present invention will become more apparent from the following description and the claims. It should be noted that the accompanying drawings are all presented in a very simplified form and not precisely drawn to scale, with the only purpose of facilitating conveniently and clearly describing the embodiments of the present invention.

The core idea of the present invention is to provide a sense amplifier, in order to solve the problem in the existing flash memory of long data read time of the sense amplifier.

In order to achieve the above idea, the present invention provides a sense amplifier for use in a flash memory. The sense amplifier includes a pre-charging circuit, a first capacitor, a first inverter, and a first transmission gate connected in parallel with the first inverter, where the pre-charging circuit is connectable to a reference voltage node of the flash memory and is able to pre-charge a bit line of the flash memory via the reference voltage node, and a potential of the reference voltage node remains unchanged after the pre-charging is completed; the potential of the reference voltage node is adjustable according to the state of the flash memory until the output voltage of the first inverter changes; one end of the first capacitor is connected to the reference voltage node, and the other end is connected to the input of the first inverter and a first end of the first transmission gate; and the output of the first inverter is connected to a second end of the first transmission gate.

Figure 1:
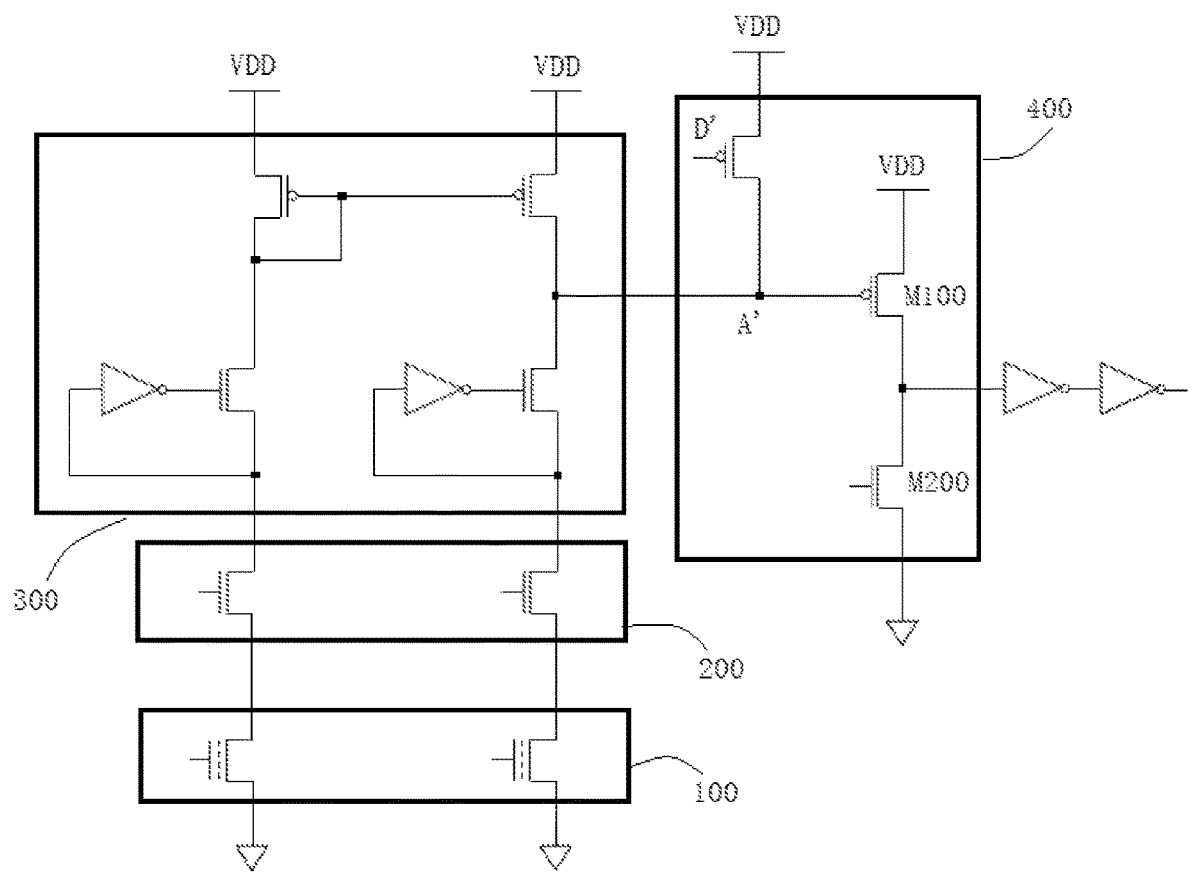
FIG. 1 is a schematic diagram of an existing sense amplifier and flash memory.
Figure 2:
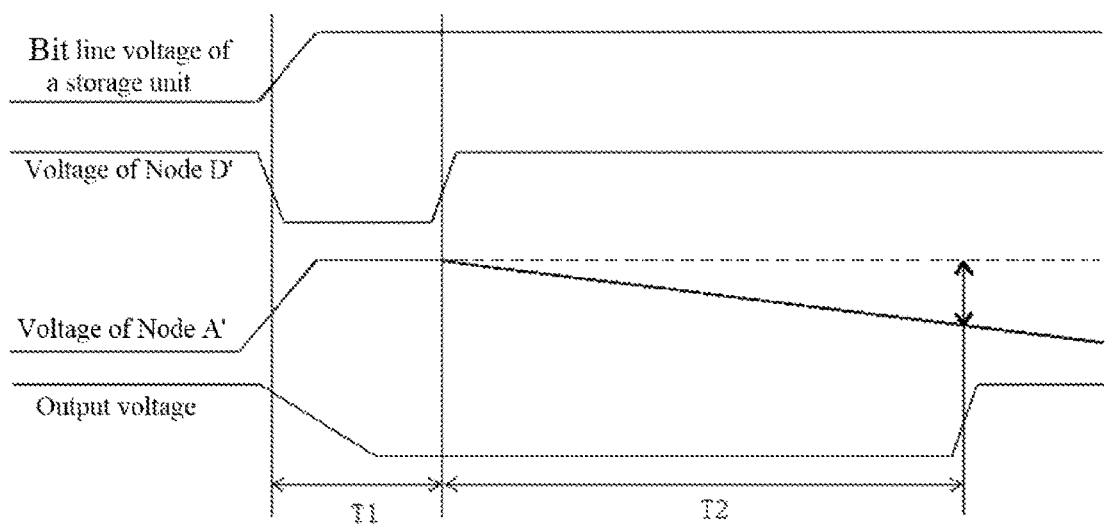
FIG. 2 is a schematic diagram of a voltage waveform of an existing sense amplifier.
Figure 3:
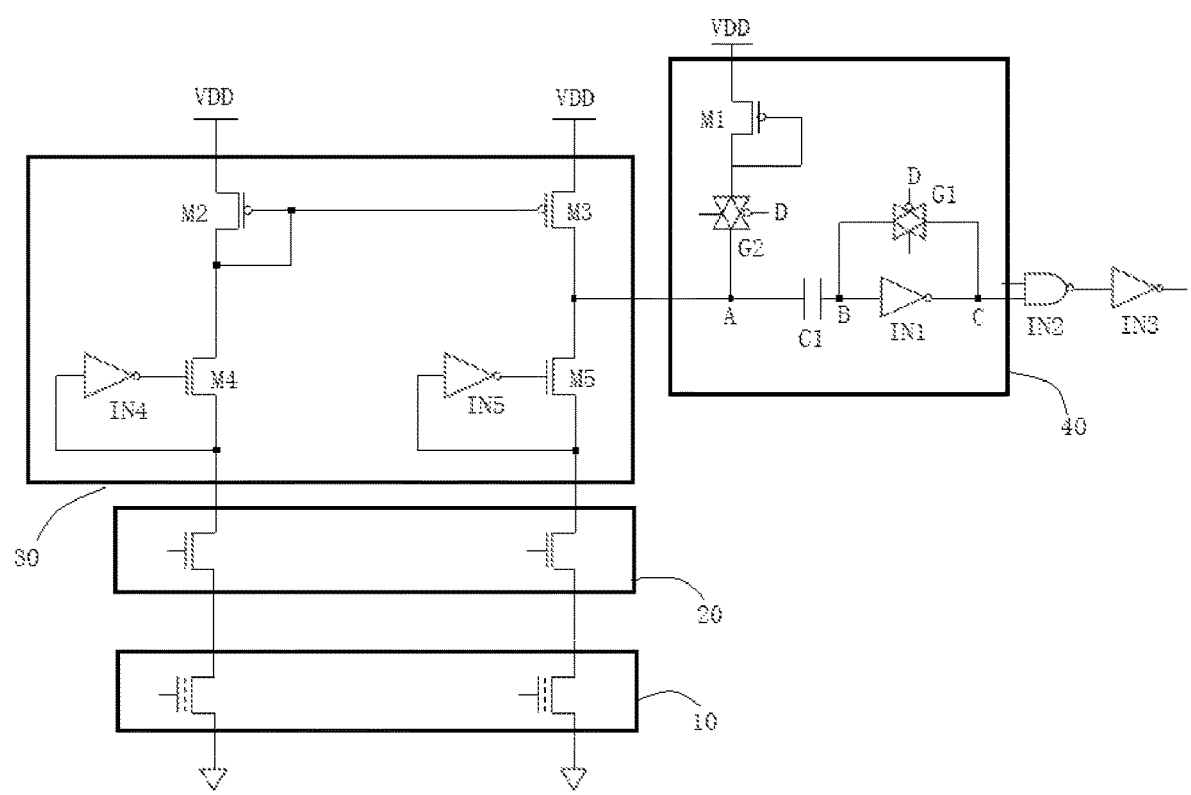
FIG. 3 is a schematic diagram of a sense amplifier and a flash memory according to an embodiment of the present invention.
Figure 4:
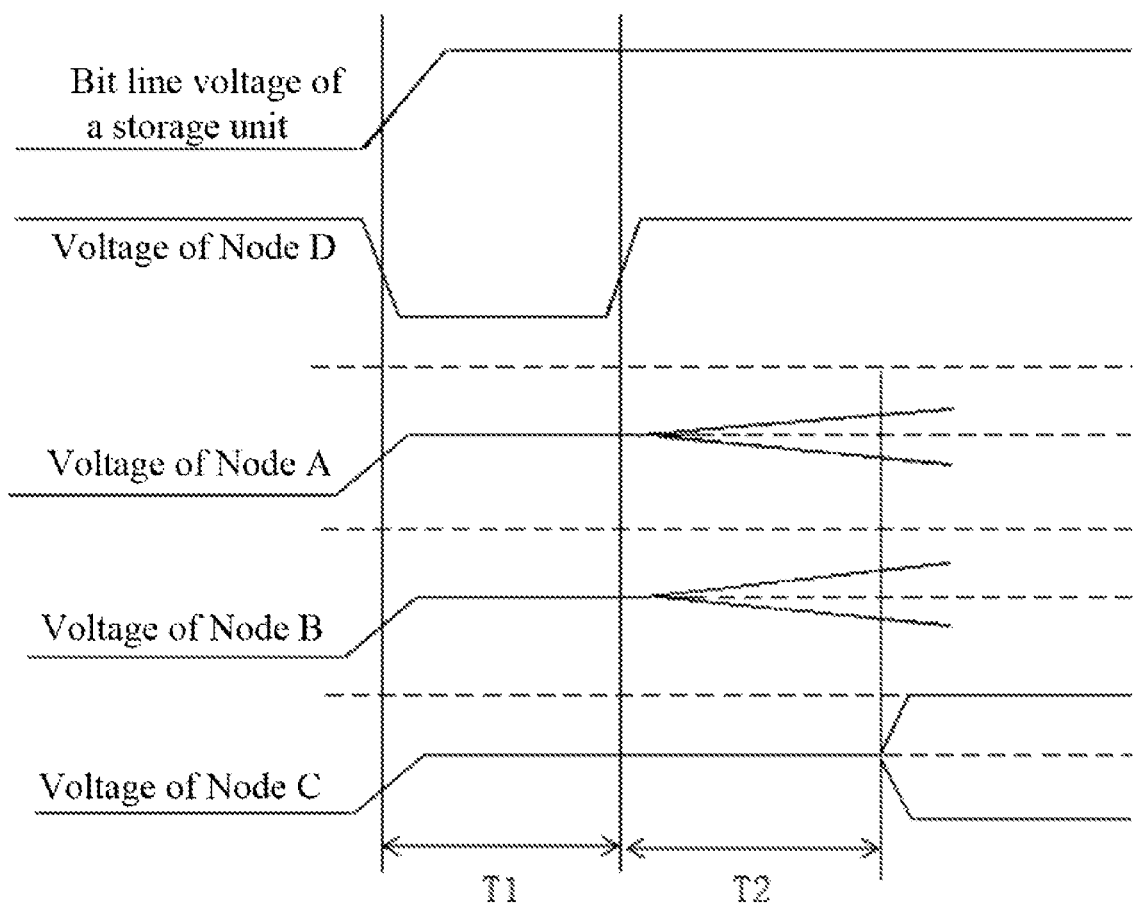
FIG. 4 is a schematic diagram of a voltage waveform of a sense amplifier according to an embodiment of the present invention.

The embodiment provides a sense amplifier 40. As shown in FIG. 3, the sense amplifier 40 is used in a flash memory. The sense amplifier 40 includes a pre-charging circuit, a first capacitor C1, a first inverter IN1, and a first transmission gate G1 connected in parallel with the first inverter IN1. The pre-charging circuit is connected between a power supply voltage VDD and a reference voltage node A of the flash memory. As shown in FIG. 4, the VDD pre-charges a bit line (in FIG. 3) of the flash memory via the reference voltage node A within a time period T1, and the potential of the reference voltage node A remains unchanged after the pre-charging is finished, i.e., kept at a first level (a voltage of node A within the time period T1). Then in a time period T2, a potential of the reference voltage node A adjusts (i.e., the voltage level at the node A always changes within the time period T2) according to the state of the flash memory (e.g. an erase reading "0" state, or an erase reading "1" state) until the output voltage of the first inverter changes. Specifically, during the time period T2, the erase reading "0" state causes a rise of the voltage level at node A, while the erase reading "1" state causes a drop of the voltage level at node A. One end of the first capacitor C1 is connected to the reference voltage node A, and the other end is connected to the input of the first inverter IN1 and a first end (i.e., node B) of the first transmission gate G1. Due to the coupling effect of the first capacitor, there is a certain difference between the voltage of node A and the voltage of node B (i.e., representing that the voltage of node B does not need to be charged to a level equals VDD), and the changes in the levels of the nodes A and B at the same time instant are equal. The output of the first inverter IN1 is connected to a second end (node C) of the transmission gate G1. As the input and the output of the first inverter IN1 are connected by means of the first transmission gate G1, the voltages thereof are associated with each other within the time period T1 (at this time, the voltage of node D is at low level, and the first transmission gate G1 is equivalent to be in a turn-on state), and the voltage of node C also rises to a certain value. The voltage of node C does not change in real time with the voltage of node B within the time period T2 (at this time, the voltage of node D is at high level, and the first transmission gate G1 is equivalent to be in a turn-off state). As the voltage of node B is at an equilibrium level of the first inverter IN1, the gain of the first inverter IN1 is maximum at this time. Moreover, as the voltage of node B changes with the voltage of node A, a correct inversion at the output of the first inverter IN1 can be achieved after merely a few tens of millivolts of change, and hence the corresponding data reading can be completed, which greatly reduces data read time, and thus improving the read speed.

In addition, as the difference between the input voltage and the output voltage of the first inverter IN1 in the second-stage sense amplifier 40 is limited to the equilibrium level of the first inverter IN1 when the pre-charging is finished, the first inverter IN1 always obtains a maximum gain. Even if a performance index mismatch exists in the field effect transistors of the sense amplifier 40, because the difference between the input voltage and the output voltage of the first inverter IN1 in the second-stage sense amplifier is limited to the equilibrium level of the first inverter, the influence of the mismatch on the sense amplifier is eliminated and high resolution is achieved.

Specifically, in the sense amplifier 40, the sense amplifier 40 further includes a second inverter IN2 and a third inverter IN3, where the input of the second inverter IN2 is connected to the output (node C) of the first inverter IN1. The output of the second inverter IN2 is connected to the input of the third inverter IN3. The output of the third inverter IN3 outputs read data. The pre-charging circuit includes a first transistor M1 and a second transmission gate G2, where the first transistor M1 is a P-channel field effect transistor. The gate of the first transistor M1 is connected to the drain of the first transistor M1. The source of the first transistor M1 is connected to the power supply voltage VDD. One end of the second transmission gate G2 is connected to the drain of the first transistor M1, and the other end is connected to the reference voltage node A.

Furthermore, in the sense amplifier 40, the first transmission gate G1 is controlled by a first control signal (the voltage of node D). When the level of the first control signal (the voltage of node D) is ground level (i.e., the time period T1), the potentials of two ends of the first transmission gate G1 are equal. When the level of the first control signal is the power supply voltage (i.e., the time period T2), the potentials of the two ends of the first transmission gate G1 are different. The second transmission gate G2 is controlled by the first control signal (the voltage of node D). When the level of the first control signal (the voltage of node D) is the ground level (i.e., the time period T1), the potentials of two ends of the second transmission gate G2 are equal. When the level of the first control signal is the power supply voltage (i.e., the time period T2), the potentials of the two ends of the second transmission gate G2 are different.

As shown in FIG. 3, the flash memory further includes a current mirroring circuit 30, a storage unit 10, and a column decoder 20, where the storage unit 10 is connected to the column decoder 20, and the column decoder 20 is connected to the current mirroring circuit 30. The current mirroring circuit 30 includes a second transistor M2, a third transistor M3, a fourth transistor M4, and a fifth transistor M5. The source of the second transistor M2 and the source of the third transistor M3 are connected to the power supply voltage VDD. The gate of the second transistor M2 is connected to the gate of the third transistor M3. The gate of the second transistor M2 is connected to the drain of the second transistor M2 and the source of the fourth transistor M4. The drain of the third transistor M3 is connected to the source of the fifth transistor M5 and the reference voltage node A. The drain of the fourth transistor M4 and the drain of the fifth transistor M5 are connected to the column decoder 20. The current mirroring circuit 30 further includes a fourth inverter IN4 and a fifth inverter IN5, where the input of the fourth inverter IN4 is connected to the drain of the fourth transistor M4. The output of the fourth inverter IN4 is connected to the gate of the fourth transistor M4; the input of the fifth inverter IN5 is connected to the drain of the fifth transistor M5, and the output of the fifth inverter IN5 is connected to the gate of the fifth transistor M5. When the storage unit 10 is in an erase state, read current (current flowing into the source of the fifth transistor M5) causes the potential of the reference voltage node to continuously decrease until the output voltage of the first inverter changes, for example, being adjusted from the first level to the second level. The first level is higher than the second level (when reading "1"); the first level is lower than the second level (when reading "0"). The second transistor and the fourth transistor constitute a reference current generation circuit. Signals provided by the storage unit 10 and the column decoder 20 cause reference current flowing through the second transistor and the fourth transistor to remain unchanged. The current mirroring circuit 30 copies the reference current to a column constituted by the third transistor and the fifth transistor. When the storage unit to which the fifth transistor is coupled is in an erase or programming state, the current on the storage unit will accordingly be different; and if the current is greater than or equal to the reference current on the third transistor in amplitude, the potential of the source of the fifth transistor changes, so that an external circuit obtains the state of the storage unit. It takes a period of time for the pre-charging circuit to pre-charge the word line of the storage unit 10 until the voltages on the word line and a bit line meet a set target value.

In the sense amplifier 40 provided by the present invention, by connecting one end of the first capacitor C1 with the reference voltage node A and the other end with the input of the first inverter IN1, and connecting the first inverter IN1 in parallel with the first transmission gate G1, the potential of the other end of the first capacitor C1 also changes correspondingly due to the coupling effect of the first capacitor C1; moreover, as the potential of node B is at an equilibrium level of the first inverter IN1, the gain of the first inverter IN1 is maximum at this time. Therefore, a correct inversion at the output of the first inverter IN1 can be achieved after merely a few tens of millivolts of change of the voltage of node B, and hence the corresponding data reading can be completed, which greatly reduces data read time, and thus improving the read speed.

In addition, as the difference between the input voltage and the output voltage of the first inverter IN1 in the second-stage sense amplifier 40 is limited to the equilibrium level of the first inverter IN1 when the pre-charging is finished, the first inverter IN1 always obtains a maximum gain. Even if a performance index mismatch exists in the field effect transistors of the sense amplifier 40, because the difference between the input voltage and the output voltage of the first inverter in the second-stage sense amplifier is limited to the equilibrium level of the first inverter, the influence of the mismatch on the sense amplifier is eliminated and high resolution is achieved.

In conclusion, the foregoing embodiments describe in detail different configurations of the sense amplifier. Certainly, the present invention includes, but is not limited to, the configurations listed in the foregoing embodiments. Any content that is transformed based on the configurations provided by the foregoing embodiments falls within the scope of protection of the present invention. Persons skilled in the art can draw inferences according to the contents of the foregoing embodiments.

The foregoing description describes only preferred embodiments of the present invention, but does not limit the scope of the present invention in any sense. All changes and

What is claimed is:

1. A sense amplifier for a flash memory, comprising a pre-charging circuit, a first capacitor, a first inverter, and a first transmission gate connected in parallel with the first inverter, wherein:
   the pre-charging circuit is configured to be connected between a power supply voltage and a reference voltage node of the flash memory and is able to pre-charge a bit line of the flash memory via the reference voltage node, wherein a potential of the reference voltage node remains unchanged after the pre-charging is completed;
   a potential of the reference voltage node is adjustable according to a state of the flash memory until an output voltage of the first inverter changes;
   the first capacitor has a first end configured to be connected to the reference voltage node, and a second end connected to an input of the first inverter and a first end of the first transmission gate;
   an output of the first inverter is connected to a second end of the first transmission gate.

2. The sense amplifier according to claim 1, further comprising a second inverter and a third inverter, wherein an input of the second inverter is connected to the output of the first inverter, and an output of the second inverter is connected to an input of the third inverter.

3. The sense amplifier according to claim 1, wherein the pre-charging circuit comprises a first transistor and a second transmission gate, wherein:
   the first transistor is a P-channel field effect transistor; a gate of the first transistor is connected to a drain of the first transistor, and a source of the first transistor is connected to the power supply voltage; a first end of the second transmission gate is connected to the drain of the first transistor, and a second end of the second transmission gate is connectable to the reference voltage node.

4. The sense amplifier according to claim 3, wherein: the first transmission gate is controlled by a first control signal; when a level of the first control signal is a ground level, the first and second ends of the first transmission gate have equal potentials; and when the level of the first control signal equals the power supply voltage, the first and second ends of the first transmission gate have different potentials.

5. The sense amplifier according to claim 4, wherein: the second transmission gate is also controlled by the first control signal; when the level of the first control signal is the ground level, the first and second ends of the second transmission gate have equal potentials; and when the level of the first control signal equals the power supply voltage, the first and second ends of the second transmission gate have different potentials.

6. The sense amplifier according to claim 1, wherein the flash memory further comprises a current mirroring circuit, a storage unit, and a column decoder, wherein the storage unit is connected to the column decoder, and the column decoder is connected to the current mirroring circuit.

7. The sense amplifier according to claim 6, wherein the current mirroring circuit comprises a second transistor, a third transistor, a fourth transistor, and a fifth transistor, wherein:
   a source of the second transistor and a source of the third transistor are connected to the power supply voltage, a gate of the second transistor is connected to a gate of the third transistor, the gate of the second transistor is connected to a drain of the second transistor and a source of the fourth transistor, a drain of the third transistor is connected to a source of the fifth transistor and the reference voltage node, and a drain of the fourth transistor and a drain of the fifth transistor are connected to the column decoder.

8. The sense amplifier according to claim 7, wherein the current mirroring circuit further comprises a fourth inverter and a fifth inverter, wherein:
   an input of the fourth inverter is connected to the drain of the fourth transistor, and an output of the fourth inverter is connected to a gate of the fourth transistor;
   an input of the fifth inverter is connected to the drain of the fifth transistor, and an output of the fifth inverter is connected to a gate of the fifth transistor.

9. The sense amplifier according to claim 6, wherein when the storage unit is in an erase state, the potential of the reference voltage node continuously decreases until the output voltage of the first inverter changes.

* * * * *